Dec. 4, 1962 H. S. YOURKE 3,067,389

TRANSISTOR IN-PHASE CURRENT AMPLIFIER

Filed July 31, 1958 2 Sheets-Sheet 1

INVENTOR.
HANNON S. YOURKE

BY Everett A. Gartrell

ATTORNEY

United States Patent Office 3,067,389

Patented Dec. 4, 1962

3,067,389

TRANSISTOR IN-PHASE CURRENT AMPLIFIER

Hannon S. Yourke, Poughkeepsie, N.Y., assignor to International Business Machines Corporation, New York, N.Y., a corporation of New York Filed July 31, 1958, Ser. No. 752,330

3 Claims. (Cl. 330—13)

The present invention is directed to transistor amplifiers. More particularly the invention relates to transistor current amplifiers which provide an amplified output current that is in phase with and is proportional to the input current. Such amplifiers may also be employed to produce a transient output current which is many times larger than its input current while affording a fast recovery after the transient.

Although transistor current amplifiers of the type under consideration have a variety of applications, they are particularly useful as drivers for translating information to distant circuits where losses due to parastic series resistances and the like undesirably result in voltage attenuation. Prior transistor current driver amplifiers have required the use of a plurality of transistors and hence have been quite costly. Since the overall speed of operation is related to the number of transistors in those amplifiers, the larger number of transistors employed therein resulted in slower operation than was desired for some applications. Prior transistor amplifiers often have afforded an impedance transformation between their input and output circuits. A transistor current amplifier which does not provide a material impedance transformation is sometimes wanted in various circuit applications.

It is an object of the invention, therefore, to provide a new and improved transistor amplifier which avoids one or more of the above-mentioned disadvantages and limitations of prior such amplifiers.

It is another object of the invention to provide a new and improved junction transistor in-phase current amplifier.

It is a further object of the invention to provide a new and improved transistor in-phase push-pull current amplifier.

It is yet another object of the invention to provide a new and improved transistor amplifier which is effective to to produce transient output current that is large in relation to its input current while affording a fast recovery after the transient.

It is a further object of the invention to provide a new and improved transistor current amplifier which is relatively simple in construction and requires but a small number of transistors.

In accordance with a particular form of the invention, a transistor in-phase current amplifier comprising load impedance means, a first current path which includes a current source and resistive impedance means directly connected without intervening coupling impedances in series with the load impedance means for translating a first current therethrough. The current amplifier further comprises a second current path which includes directly connected in series with each other and with the load impedance means and without intervening coupling impedances a resistor having a resistance about one third of that of the aforesaid resistive impedance means, biasing means excluding any resistors, and a junction transistor having its collector-emitter electrodes connected between the aforesaid resistor and the biasing means, the transistor having its emitter-base electrodes directly connected in shunt with the resistive impedance means through the resistor, without intervening coupling impedances, whereby the transistor is responsive to the aforesaid first current for developing and supplying to the load impedance means a second current which is in-phase with, is proportional to, and augments the first current. The amplifier also includes means coupled across the load impedance means for deriving a signal output for developing and supplying to the load impedance means a second unidirectional current which is in phase with, is proportional to, and augments the first current, the magnitudes of the currents being substantially independent of the values of the load impedance means.

Other objects of the invention will be pointed out in the following description and claims and illustrated in the accompanying drawings which disclose, by way of example, the principle of the invention and the best mode that has been contemplated of applying that principle.

Figure 1:
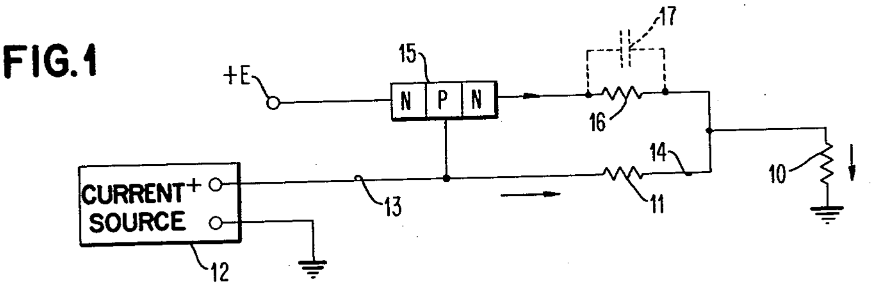
FIGURE 1 is a circuit diagram of a transistor amplifier in accordance with a particular form of the invention.

*Description of FIGURE 1 Transistor Amplifier*

Referring now to FIGURE 1 of the drawings, the transistor current amplifier there represented comprises a load impedance means such as a load resistor 10. The amplifier also includes means including resistive impedance means such as a resistor 11 for translating a first unidirectional current therethrough to the resistor 10. This translating means also includes a current source 12, a conductor 13 connected between the ungrounded terminal of the source and one terminal of resistor 11, and a second conducotr 14 interconnecting the remaining terminal of resistor 11 and the ungrounded terminal of resistor 10.

The current amplifier further includes means including a resistor 16, and a transistor such as an NPN junction transistor 15 responsive to the aforesaid first current through resistor 11 for developing and supplying to the load resistor 10 a second unidirectional current which is in phase with, is proportional to, and augments the first current, the magnitudes of the currents being substantially independent of the value of the load resistor. The transistor 15 has its emitter connected through resistor 16 to the junction of resistors 10 and 11 and has its base connected directly to the remaining terminal of resistor 11. The selected value of resistor 16 in relation to that of resistor 11 depends upon the current gain desired since the in-phase small signal gain is approximately $$1+\frac{R_{11}}{R_{16}}$$

where $R_{11}$ and $R_{16}$ are respectively the values of resistors 11 and 16. A source of reverse biasing potential +E is connected to the collector of transistor 15. For those applications wherein current pulses may be translated, a coupling capacitor 17, which has been represented in broken-line construction, may be employed in parallel with the resistor 16 for improving the speed of response of the circuit to the edge-portions of the pulses.

*Operation of FIGURE 1 Amplifier*

Considering now the operation of the current amplifier, current source 12 supplies a current which flows in the direction indicated by the arrows through the resistors 11 and 10. This current flowing through the resistor 11 creates a voltage drop which is impressed between the emitter and base of the transistor 15 in a sense to render the base more positive than the emitter. The transistor is therefore rendered conductive and the collector-to-emitter current thereof flows through the resistor 16 and into the load resistor 10. This current is in phase with that supplied to the load resistor by resistor 11, is proportional to the latter current which develops it, and augments the current from resistor 11. Thus if one unit of current flows through resistor 11 and the transistor affords a gain of three and hence supplies three units of emitter current, four units of unidirectional current are supplied to the load resistor 10. In this situation, the resistor 16 would have a resistance about one third that of resistor 11. A material impedance transformation does not exist between the current input and output terminals of the amplifier. The magnitudes of the two in-phase currents which flow in the load resistor 10 are substantially independent of the size of that resistor so that flexibility exists in the selection of the size of the load impedance to conform with the requirements of the particular application of the current amplifier.

Figure 2:
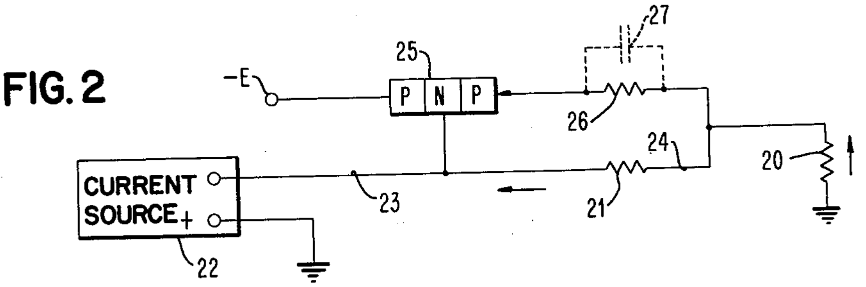
FIGURE 2 is a circuit diagram of a modified form of the amplifier of FIGURE 1.

*Description of FIGURE 2 Amplifier*

The in-phase current amplifier of the present invention may also employ a PNP transistor, and such an amplifier is represented in FIGURE 2. Except for the type of transistor used, a current source poled opposite to that shown in FIGURE 1, and biasing means of the opposite polarity, the amplifier of FIGURE 2 corresponds exactly with that of FIGURE 1. Accordingly, corresponding elements are designated by the same reference numerals with the number 10 added thereto.

Currents flow in the load resistor 20 and the other circuit elements in the direction indicated by the arrows in FIGURE 2 and hence are in a direction opposite to that represented in FIGURE 1 for reasons well understood in the art. Having explained the operation of the corresponding FIGURE 1 amplifier, it is deemed unnecessary to do this for the FIGURE 2 device.

Figure 3:
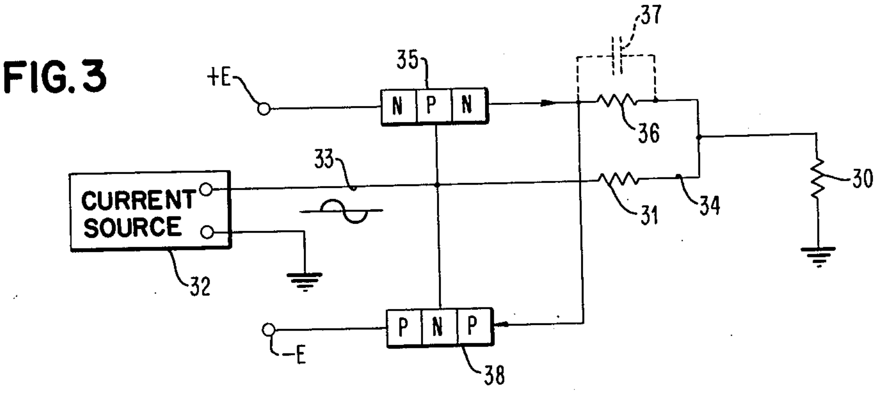
FIGURE 3 is the circuit diagram of a push-pull transistor amplifier also in accordance with the invention.

*Description of FIGURE 3 Push-Pull Amplifier*

FIGURE 3 is a circuit diagram of a push-pull transistor current amplifier which is very similar to that of FIGURE 1. Accordingly, corresponding elements are designated the same reference numerals with the number 20 added thereto. The current source 32 is one which supplies during recurring intervals a first current which varies in a predetermined sense about a reference level and supplies during intervals intervening the first mentioned intervals a second current varying in the opposite sense about that level. For example, source 32 may supply to the series-connected resistors 31 and 30 an alternating current such as a sine wave having positive and negative half cycles as represented. The amplifier of FIGURE 3 differs from that of FIGURE 1 in the use of an additional transistor 38 which is of a conductivity type opposite to that of transistor 35, and hence is of the PNP type. The emitters of the complementary transistors 35 and 38 are interconnected as are their bases. The collector of transistor 38 is biased in the reverse direction by a source —E.

*Operation of FIGURE 3 Amplifier*

In considering the operation of the push-pull current amplifier of FIGURE 3, it will be assumed initially that a positive half cycle of a sine wave of current is being momentarily supplied by the current source 32 to the series-connected resistors 31, and 30. Current flows in load resistor 30 to ground from its junction with resistor 31. In the manner explained above in connection with FIGURE 1, the flow of current through resistor 31 to resistor 30 and ground applies a forward bias between the emitter and base of transistor 35, and the developed flow of emitter current through the resistor 36 to load resistor 30 is superimposed on that delivered to the latter from resistor 31. During this time, transistor 38 remains nonconductive due to the reverse bias between its base and emitter. At the end of the positive half cycle under consideration, the forward bias on transistor 35 terminates and it no longer conducts. On the succeeding negative half cycle of the supplied current wave, the direction of current flow through resistors 30 and 31 is reversed and is therefore in a sense to bias the base of the PNP transistor 38 more negatively than its emitter and thus render that transistor conductive. Current flowing through the transistor 38 is returned to ground through the collector biasing source —E and augments that delivered to the load resistor 30 by the source 32. The augmenting currents delivered by the transistors are in phase with the corresponding half cycles of current supplied by source 32. When the negative half cycle terminates, transistor 38 no longer conducts and the amplifier is now conditioned to repeat the described cycle of operation for succeeding cycles of alternating current supplied by source 32. It will be seen that the amplifier of FIGURE 3 constitutes a single-ended push-pull current amplifier.

Figure 4:
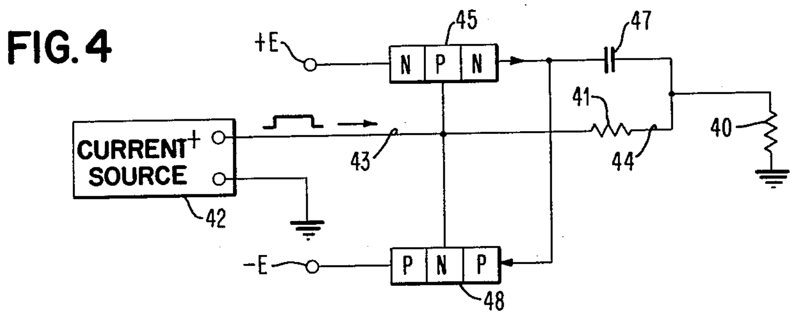
FIGURE 4 is the circuit diagram of a current pulse amplifier embodying a modified form of the present invention.

*Description of FIGURE 4 Amplifier*

Referring now to FIGURE 4, there is represented an in-phase current amplifier which is particularly adapted to translate current pulses since it provides a relatively large current overdrive at the leading and trailing edge portions of the pulses while affording a short recovery time from the overdrive. Since this amplifier is quite similar to that of FIGURE 3, corresponding elements in FIGURE 4 are identified by the same reference numerals with the number 10 added thereto. For convenience of explanation, it will be noted that the current source 42 is represented as supplying a positive current pulse to resistor 41. However, it is to be understood that alternating currents may be supplied for amplification by the amplifier of FIGURE 4. Also the capacitor 47 is not shunted by a resistor.

*Operation of FIGURE 4 Amplifier*

Figure 5:
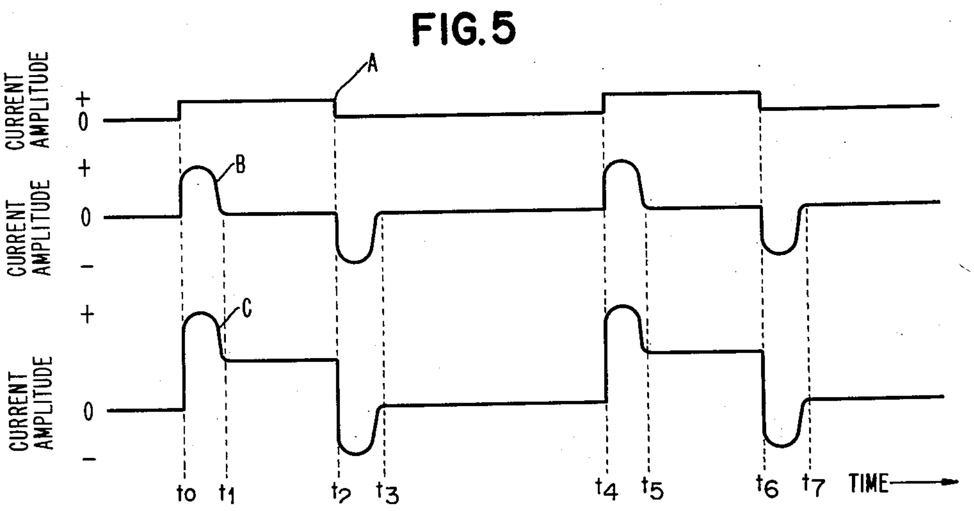
FIGURE 5 is a graph utilized in explaining the operation of the FIGURE 4 amplifier.

In considering the operation of the current amplifier of FIGURE 4, it will be assumed that positive current pulses such as those represented by curve A of FIGURE 5 are supplied by the current source 42 to the series combination of resistors 41 and 40. At time $t_0$ corresponding to the leading edge of the first current pulse translated by resistor 41, a positive step or transient is applied to the base of NPN transistor 45 to render it conductive. Capacitor 47 proceeds to charge rapidly through that transistor, the current increasing very abruptly at $t_0$ as represented by curve B of FIGURE 5 and then decreasing during the balance of the interval $t_0$–$t_1$ whereupon it reaches its original level at time $t_1$. At time $t_1$ the capacitor achieves its maximum positive voltage or charge on its electrode connected to the emitter of transistor 45. Since source 42 supplies through resistor 41 to the load resistor 40 the current pulse of curve A, and transistor 45 and capacitor 47 develop at time $t_0$–$t_1$ the positive spike of curve B for application to the resistor 40, and the resultant current in the load resistor has the waveform represented by curve C. Thus a large positive transient current appears in the load resistor at time $t_0$–$t_1$ and is suitable for control purposes. This transient may be many times the amplitude of the current pulse of curve A. During the interval $t_1$–$t_2$ when the circuit has recovered from the transient, the current through the load resistor 40 has a magnitude corresponding to that of curve A, the capacitor 47 has charged to the potential appearing across resistor 41, and both transistors have no forward bias.

At time $t_2$ the trailing edge of the input current pulse of curve A swings abruptly in a negative direction and returns to its initial value. This negative step renders the base of the PNP transistor 48 more negative than its emitter, thus rendering that transistor conductive and quickly discharging the capacitor 47 through the transistor. A negative spike of current, which is represented by curve B of FIGURE 5 during the interval $t_2$–$t_3$, flows through the capacitor 47 and transistor 48 and appears in the load resistor 40 as the corresponding negative current spike of curve C. This spike is also useful for control purposes.

At time $t_4$–$t_7$ the second current pulse of curve A is supplied by the source 42 and a cycle of operation corresponding to that occurring during the interval $t_0$–$t_3$ is repeated.

If the PNP and the NPN transistors 45 and 48 have substantially identical frequency-translation characteristics, the transient overdrive occurring at the leading and trailing edges of the input current pulses supplied by unit 42 will be substantially identical except, of course, for polarity. The large current overdrive available with the circuit of FIGURE 4 is applicable to transistor logic circuits to obtain higher operating speeds and a very large fanout.

Figure 6:
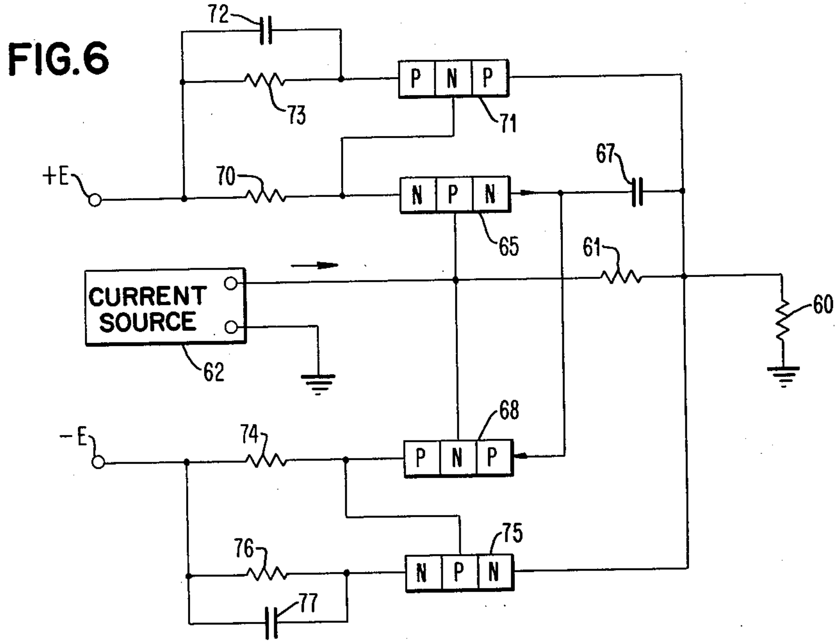
FIGURE 6 is the circuit diagram of a modification of the amplifier of FIGURE 4.

*Description of FIGURE 6 Amplifier*

The amplifier of FIGURE 6 is similar to that of FIGURE 4 and is useful in obtaining additional current overdrive with essentially the same recovery after transients as the amplifier of FIGURE 4. Corresponding components in the FIGURE 6 amplifier are designated by the same reference numerals employed in FIGURE 4 but with the number 20 added thereto. The collector circuits of transistors 65 and 68 contain added resistors 70 and 74 respectively. The collector of transistor 65 is connected to the base of a PNP transistor 71 and the emitter of the latter is connected through a parallel-connected resistor-capacitor network 73, 72 to the source +E. Transistor 71 and a similarly arranged transistor 75 have their collectors connected to the ungrounded terminal of resistor 60. The base of transistor 75 is connected to the collector of transistor 68 and its emitter is connected to the source −E through a parallel connected resistor-capacitor network 76, 77.

The operation of the FIGURE 6 amplifier is substantially the same as that of the FIGURE 4 amplifier, differing therefrom in that the collector currents of transistors 65 and 68 are amplified in a conventional manner by transistors 71 and 75, respectively, and are supplied by their collectors to the common load circuit to provide additional current overdrive.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A transistor in-phase current amplifier comprising:
load impedance means;
a first current path which includes a current source and resistive impedance means directly connected without intervening coupling impedances in series with said load impedance means for translating a first current therethrough;
a second current path which includes directly connected in series with each other and with said load impedance means and without intervening coupling impedances a resistor having a resistance about one third of that of said resistive impedance means, biasing means excluding any resistors, and a junction transistor having its collector-emitter electrodes connected between said resistor and said biasing means, said transistor having its emitter-base electrodes directly connected in shunt with said resistive impedance means through said resistor without intervening coupling impedances, whereby said transistor is responsive to said first current for developing and supplying to said load impedance means a second current which is in phase with, is proportional to, and augments said first current; and
means coupled across said load impedance means for deriving a signal output.

2. A push-pull transistor in-phase current amplifier comprising:
load impedance means;
a first current path which includes a current source and resistive impedance means directly connected without intervening coupling impedances in series with said load impedance means for translating therethrough a first current varying in a predetermined sense about a reference level and for translating therethrough during intervals intervening said recurring intervals a second current varying in the opposite sense about said level;
a second current path which includes directly connected in series with each other and with said load impedance means and without intervening coupling impedances a resistor, a first biasing means, and a first transistor of one conductivity type having its emitter and collector connected between said resistor and biasing means, said transistor having its emitter and base directly connected in shunt with said resistive impedance means through said resistor without intervening coupling impedances, whereby said transistor is responsive to said first current for developing and supplying to said load impedance means a third current which is in phase with, is proportional to, and augments said first current;
a third current path which includes a second biasing means, a second transistor of the opposite conductivity type having its emitter and collector connected in series with said resistor and said load impedance means across said second biasing means and having its emitter and base connected directly and without intervening coupling impedances, respectively, to said emitter and base of said first transistor for supplying a fourth current which is in phase with, is proportional to, and augments said second current; and
means coupled across said load impedance means for deriving a signal output.

3. A push-pull transistor in-phase current amplifier comprising:
load impedance means;
a first current path which includes a current source and resistive impedance means directly connected without intervening coupling impedances in series with said load impedance means for translating therethrough a first half of an alternating current and for translating therethrough during intervals intervening said recurring intervals a second half of said alternating current;
a second current path which includes directly connected in series with each other and with said load impedance means and without intervening coupling impedances a parallel-connected resistor-capacitor network, a first biasing means, and a first transistor of one conductivity type having its collector-emitter electrodes connected between said resistor-capacitor network and biasing means, said transistor having its emitter-base electrodes directly connected in shunt with said resistive impedance means through said resistor-capacitor network without intervening coupling impedances, whereby said transistor is responsive to said first current for developing and supplying to said load impedance means a third current which is in phase with, is proportional to, and augments said first half of said alternating current;
a third current path which includes a second biasing means, a second transistor of the opposite conductivity type having its collector-emitter electrodes connected in series with said resistor-capacitor network and said load impedance means across said second biasing means and having its emitter-base electrodes connected directly and without intervening coupling impedances, respectively, to emitter-base electrodes of said first transistor for supplying a fourth current which is in phase with, is proportional to, and augments said second half of said alternating current; and means coupled across said load impedance means for deriving a signal output.

References Cited in the file of this patent

UNITED STATES PATENTS

| | | |
|---|---|---|
| 2,531,076 | Moore | Nov. 21, 1950 |
| 2,641,717 | Toth | June 9, 1953 |
| 2,691,075 | Schwartz | Oct. 5, 1954 |
| 2,789,164 | Stanley | Apr. 16, 1957 |
| 2,791,645 | Bessey | May 7, 1957 |
| 2,808,471 | Poucel et al. | Oct. 1, 1957 |
| 2,847,519 | Aronson | Aug. 12, 1958 |
| 2,852,625 | Nuut | Sept. 16, 1958 |
| 2,858,379 | Stanley | Oct. 28, 1958 |
| 2,860,195 | Stanley | Nov. 11, 1958 |

OTHER REFERENCES

Sulzer: "Junction Transistor Circuit Applications," Electronics, August 1953, pages 170–173.

Aronson et al.: "Tranisistor Audio Frequency Amplifier," RCA Technical Notes No. 36, received U.S. Patent Office August 9, 1957.

Schuster: "D.C. Transistor Amplifier for High Impedance Input," Electronics, Engineering Edition, February 28, 1958, pages 64, 65.

Anzalone: "Electronic Design," June 1, 1957, pages 38–41 relied upon.